United States Patent
Sharma et al.

(10) Patent No.: US 6,548,122 B1
(45) Date of Patent: *Apr. 15, 2003

(54) METHOD OF PRODUCING AND DEPOSITING A METAL FILM

(75) Inventors: Sunity Sharma, Fremont, CA (US); Subhash Narang, Palo Alto, CA (US); Kuldip Bhasin, Chandigar (IN); Madan Lal Sharma, Chandigar (IN)

(73) Assignee: SRI International, Menlo Park, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/444,031

(22) Filed: Nov. 19, 1999

Related U.S. Application Data

(63) Continuation-in-part of application No. 09/042,182, filed on Mar. 12, 1998, now Pat. No. 5,980,998, and a continuation-in-part of application No. 09/412,047, filed on Oct. 4, 1999, now abandoned.

(60) Provisional application No. 60/060,711, filed on Sep. 16, 1997.

(51) Int. Cl.[7] .............................. B32B 3/00; B32B 7/00; B32B 15/00

(52) U.S. Cl. ..................... 427/559; 427/556; 427/96; 427/552; 427/256; 427/558; 427/597; 427/555; 430/313; 430/315; 428/208; 428/901

(58) Field of Search ................................ 427/559, 556, 427/96, 552, 256, 558, 597, 555, 226, 229; 430/313, 315; 428/209, 901

(56) References Cited

U.S. PATENT DOCUMENTS

| | | | | |
|---|---|---|---|---|
| 3,994,727 A | * | 11/1976 | Polichette et al. | 96/38.4 |
| 4,614,837 A | * | 9/1986 | Kane et al. | 174/68.5 |
| 4,808,274 A | * | 2/1989 | Nguyen | 204/15 |
| 5,094,686 A | | 3/1992 | Kawakami et al. | 75/343 |
| 5,281,447 A | * | 1/1994 | Brady et al. | 427/555 |
| 5,378,508 A | * | 1/1995 | Castro et al. | 427/556 |
| 5,534,312 A | * | 7/1996 | Hill et al. | 427/533 |
| 5,632,942 A | | 5/1997 | Yeh et al. | 156/89 |

OTHER PUBLICATIONS

Edwards et al., *J.C.S. Dalton*, p. 2463 (1973).

* cited by examiner

*Primary Examiner*—Shrive P. Beck
*Assistant Examiner*—Jennifer Kolb Michener
(74) *Attorney, Agent, or Firm*—Rutan & Tucker, LLP; Robert D. Fish

(57) ABSTRACT

Methods and apparatus are provided in which a metal precursor is formed in a process that includes the following steps: depositing a metal precursor on a substrate; adding an energy to reduce the metal precursor and to precipitate metal on the substrate as a continuous metal layer; and selecting the metal precursor and the energy such that the purity of the continuous metal layer is greater than 85%, and/or the deposited layer has an electrical conductivity substantially that of a pure metal. Methods and apparatus are also provided in which a metal is deposited onto a substrate by a process which includes the following steps: depositing the metal precursor onto the substrate in a desired pattern; and applying sufficient energy to decompose the precursor to precipitate metal in a continuous metal layer in the desired pattern.

16 Claims, 2 Drawing Sheets

METHOD OF PRODUCING AND DEPOSITING A METAL FILM

This application is a continuation in part of U.S. application Ser. No. 09/042,182, now U.S. Pat. No. 5,980,998, filed Mar. 12, 1998 and, U.S. application Ser. No. 09/412, 047, now abandoned, filed Oct. 4, 1999, which both claim the benefit of U.S. Provisional Application No.: 60/060,711, filed Sep. 16, 1997, and incorporated herein by reference in their entirety.

This invention was made with Government support under Contract No. DAAL01-96-C-0104 awarded by the United States Army Research Laboratory. The Government has certain rights in the invention.

FIELD OF THE INVENTION

The field of the invention is surface deposition of transition metals.

BACKGROUND

Transition metals have several important uses in industry, such as components for metal alloys, electrical wiring and components, pipes, paint, industrial and automotive catalysts, and photographic paper.

It is important that the transition metal or metal alloy used is relatively pure with respect to the component metals, especially in electrical wiring and components. Therefore, it is imperative to control production of the desired transition metals and alloys such that contamination of the metals by impurities is held to a minimum.

It is equally important to produce the transition metal or metal alloy in sufficient quantities to make their use efficient and economical. Edwards et al. (Edwards) has described a method of making copper (I) formate, which can be used as a copper metal precursor, from anhydrous copper (II) formate. *J.C.S. Dalton*, p. 2463 (1973). However, the methods used by Edwards produce an insignificant amount of copper (I) formate formation (about 2%).

U.S. Pat. No. 5,094,686 issued to Kawakami et al. (March 1992) teaches that a fine copper powder can be formed through thermal decomposition of a copper complex. Kawakami, however, uses anhydrous copper formate and other anhydrous copper complexes as precursors to formation of copper powder. Kawakami limits the decomposition process to the solid phase of the copper complex precursor, and further limits the atmosphere of the decomposition process to be a non-oxidizing atmosphere.

U.S. Pat. No. 3,994,727 issued to Polichette et al. (Polichette) discloses a method of forming metal images using reducible metal salts and light sensitive reducing agents. There are two distinct layers on top of the substrate surface: a catalytic, non-conductive real image and an electrolessly deposited metal in the formation of the catalytic real image. Incorporated with the two distinct layers is an epoxy laminate that is designed to be an adhesive and a protectant. The laminate partially decomposes upon application of an energy source, but does not evaporate from the metal surface. Thus, the metal layer is contaminated with non-volatile decomposition products from the epoxy laminates.

Thus, there is still a need to efficiently produce metal complexes, pure metals and metal alloys in high concentrations without significant contamination.

SUMMARY OF THE INVENTION

The present invention provides methods and apparatus in which a metal precursor is formed in a process that includes the following steps: depositing a metal precursor on a substrate; adding an energy to reduce the metal precursor and to precipitate metal on the substrate as a continuous metal layer; and selecting the metal precursor and the energy such that the purity of the continuous metal layer is greater than 85%.

The present invention also provides methods and apparatus in which a metal is deposited onto a substrate by a process which includes the following steps: depositing the metal precursor onto the substrate in a desired pattern; and applying sufficient energy to decompose the precursor to precipitate metal in a continuous metal layer in the desired pattern.

Various objects, features, aspects and advantages of the present invention will become more apparent from the following detailed description of preferred embodiments of the invention, along with the accompanying drawings in which like numerals, represent like components.

DETAILED DESCRIPTION

Figure 1:
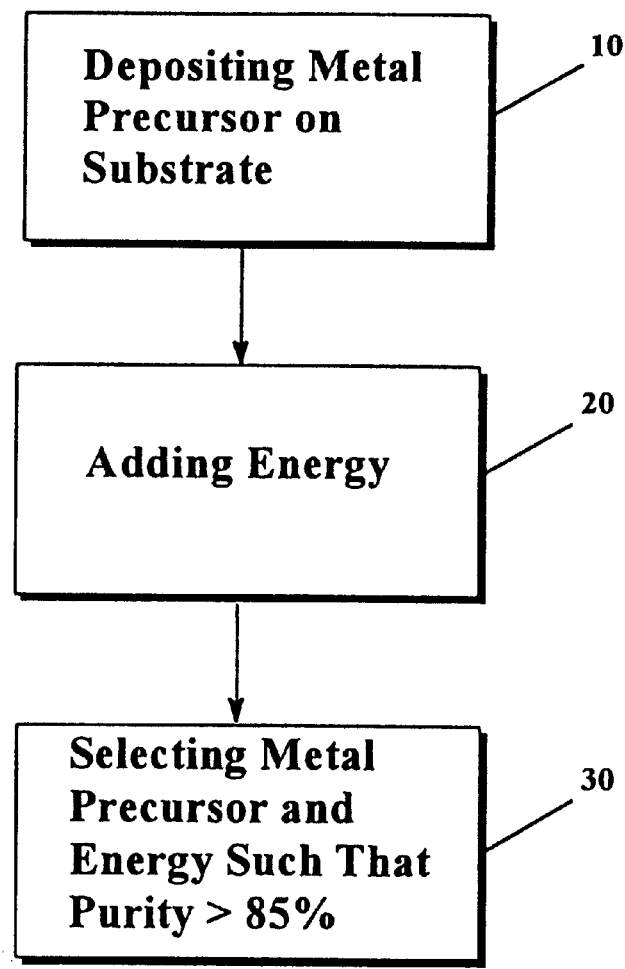
FIG. 1 is a preferred embodiment for production of metal precursors.

As shown in FIG. 1, metal precursors can be produced by depositing a metal precursor on a substrate 10; adding an energy to reduce the metal precursor and to precipitate metal on the substrate as a continuous metal layer 20; and selecting the metal precursor and the energy such that the purity of the continuous metal layer is greater than 85% 30.

As used herein, the term "transition metal" means those elements that are in the d-block and f-block of the Periodic Chart of the Elements; that exhibit a variety of oxidation states; and that can form numerous complex ions. As used herein, the phrase "d-block" means those elements that have electrons filling the $3d$, $4d$, $5d$, and $6d$ orbitals surrounding the nucleus of the element. As used herein, the phrase "f-block" means those elements that have electrons filling the $4f$ and $5f$ orbitals surrounding the nucleus of the element, including the lanthanides and the actinides. Preferred transition metals are those transition metals that are desirable for use in such industries as the electronics, computer, semiconductor industries. Those preferred transition metals include cobalt, copper, nickel, zinc, vanadium, chromium, platinum, gold, silver, tungsten, and molybdenum. More preferred transition metals include copper, nickel, platinum, gold, silver and tungsten. Most preferred transition metals include copper and nickel. The term "transition metal" also includes alloys, metal/metal composites, metal ceramic composites, metal polymer composites, as well as other metal composites.

As used herein, the term "compound" means a substance with constant composition that can be broken down into elements by chemical processes. As used herein, the term "molecule" means a bonded collection of two or more atoms of the same or different elements. As used herein, the term "precursor" means that substance that precedes and that may be the source of another substance.

It is contemplated that a metal precursor can be provided by any suitable source, including acquiring the complex from a chemical manufacturing source, university, or other outside source, or acquiring the complex through synthesis. In preferred embodiments, a metal precursor is provided by a manufacturing source.

It is further contemplated that the metal precursor may comprise either a metallic salt and an appropriate solvent or a mixture of a metallic salt, a reducing agent, and an appropriate solvent.

As used herein, the term "reducing agent" means a neutral molecule or ion having a lone pair of electrons that can be used to form a bond to a metal ion. The reducing agent may or may not be initially complexed to the metal precursor. It is contemplated that preferred reducing agents may comprise nitrogen donors, sulfur donors, or phosphorus donors. In preferred embodiments, reducing agents are β-picoline, lutidines, quinoline, isoquinoline, cyclopentylamine, cycloheptylamine, cyclooctylamine, and so forth. In more preferred embodiments, reducing agents are β-picoline and cyclopentylamine. In most preferred embodiments, reducing agents are β-picoline.

It is contemplated that an appropriate solvent may be added to the metal precursor. It is further contemplated that the solvent may be polar or non-polar. It is still further contemplated that the solvent may be in pure form or mixed with another appropriate solvent. As used herein, the term "solvent" means that part of a solution that is the dissolving medium for the other components. As used herein, the term "polar" means those molecules or collection of molecules that have a permanent dipole moment. As used herein, the term "non-polar" means those molecules or collection of molecules that do not have a permanent dipole moment. As used herein, the phrase "dipole moment" means a property of a molecule whose charge distribution can be represented by a center of positive charge and a center of negative charge.

As used herein, the term "reacting" means any exothermic or endothermic interaction between the metal precursor and the energy source. As used herein, the term "exothermic" means that reaction where energy, as heat, flows out of the system. As used herein, the term "endothermic" means that reaction where energy as heat, flows into the system.

It is contemplated that reacting the metal precursor can take place in any suitable vessel or on any suitable surface. It is contemplated that a suitable vessel is one that is accessible to the operator and relatively cost efficient. A suitable vessel includes a petri dish, a beaker, an Erlenmeyer flask, a graduated cylinder, or a test tube. It is also contemplated that a suitable vessel may comprise any appropriate material, such as glass, ceramic, or metal. It is contemplated that a suitable surface may be flat, curved, rough, smooth, solid, liquid, or gas. It is also contemplated that a suitable surface may comprise any appropriate material, such as glass, ceramic, metal, water, ice, or steam.

It is contemplated that reacting the metal precursor may occur spontaneously. As used herein, the term "spontaneous" means that reaction that occurs without any outside intervention from any source, such as a heat source, a vibrational source, or a mixing source. It is also contemplated that reacting the metal precursor may occur non-spontaneously. In preferred embodiments, the reaction between the energy source and the metal precursor occurs non-spontaneously by the addition of energy to the solution of reactants.

In preferred embodiments, the energy may come from any suitable source, including point sources, such as lasers; extended/non-point sources, such as a UV-VIS source, an infra-red source, a heat source, both radiative and convective, or a microwave source; or electron sources, such as electron guns or plasma sources. Other suitable energy sources include electron beams, and radiative devices at non-IR wavelengths including x-ray, and gamma ray. Still other suitable energy sources include vibrational sources such as microwave transmitters. In preferred embodiments, the energy source is an extended source. In more preferred embodiments, the energy source is a heat source.

It is contemplated that any additional solvent may or may not be evaporated from the solution before, during or after application of the energy from the energy source. In preferred embodiments, the solvent is not removed from solution. In more preferred embodiments, the solvent is partially removed from solution.

It is contemplated that the reaction of the metal precursor with the energy source leads to the formation of a pure metal. Once the metal precursor is produced, it can be used in a variety of different applications, including biochemical, electrical and chemical. In preferred embodiments, the metal precursor is used in electrical applications as precursors to the formation of pure metals. In additional embodiments, the metal precursor is deposited on a substrate in a desired pattern. Once a desired pattern is deposited, energy is applied that is sufficient to decompose the precursor solution to form a patterned precipitate of continuous metal, and thus forming the patterned metal on the substrate.

Figure 2:
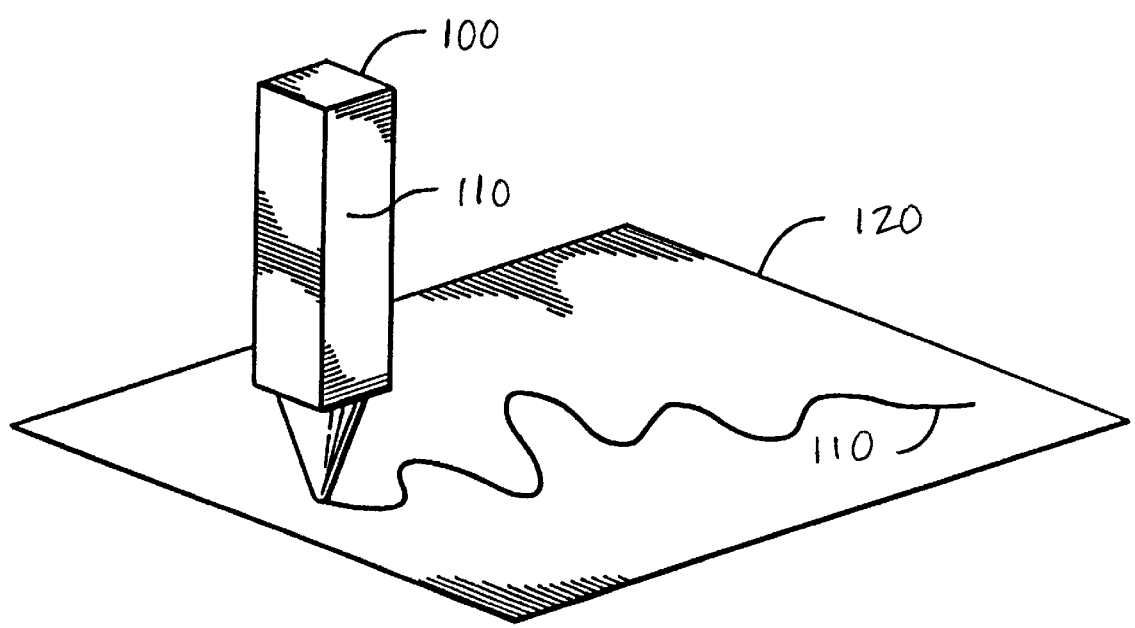
FIG. 2 is a preferred embodiment for deposition of metal precursors onto a substrate.

In FIG. 2, a dispenser 100 containing the metal precursor solution 110 is used to deposit the solution onto a substrate 120. As described below, there are many possible variations to each of these components.

Dispenser 100 is contemplated to be any device that is capable of forming a desired pattern or an indiscriminate layer by dispensing the metal precursor solution onto a substrate through relative movement between the substrate and at least some portion of the dispenser. Conceptually, dispenser 100 can include two parts, a reservoir for holding the precursor solution and an applicator. In one class of preferred embodiments, for example, dispenser 100 can be a "point" dispenser, such as an ink jet-type printer cartridge, a capillary nib, a roller dispenser, a sprayer, or even the end of a compacted mass similar to a pencil lead. In such embodiments the reservoir acts as a holding tank for the dispensed solution, while the applicator is some form of drawing head. Depending on the specific embodiment, such devices can dispense the precursor solution anywhere from an accuracy of tens of Angstroms or less to a millimeter or more.

It is not necessary for the reservoir to be solutionally or even mechanically coupled to the applicator. For example, the applicator may comprise a rubber or lithograph type stamp, and the reservoir may comprise a stamp pad. In such embodiments there need not be any relative movement at all between the substrate and the reservoir, and instead a relative movement between the applicator and the substrate can be used to form the desired pattern or layer. In still other embodiments the applicator need, not translate bodily relative to the substrate, but may tilt or rotate to produce the desired pattern or layer. In still other embodiments, both the reservoir and the applicator may be immobile relative to the substrate, and the precursor solution dispensed through the applicator may be directed by pneumatic, magnetic or other forces to form the desired pattern or layer.

Thus, it is contemplated that virtually any type of dispenser may be used in the present subject matter. This broad definition includes, for example, all common methods of printing, including ink jet cartridge type dispensers, thread dispensers, and sprayers, stamping, roller printing, letter press printing, gravure printing, screen printing, flexographic printing, planographic printing, offset printing, mimeographic printing, and the like. In fact, any printing process that uses inks can be employed effectively with embodiments of the present teachings.

On the other hand, the term "dispenser" excludes immersion baths or other techniques in which the entire substrate is coated indiscriminately. It should also be understood that the phrases "onto a surface of the substrate" and "onto the substrate" refer to deposition that is at least significantly disposed on an outer boundary of the substrate. For adsorbent or porous substrates, for example, these and related terms include both depositions in which all of the material being deposited remains on the apparent surface of the substrate, and also depositions in which some of the material being deposited is drawn into the substrate.

The patterns contemplated to be dispensed using apparatus and methods described herein include any arrangement of points or dots, whether isolated or combined to form lines, filled-in spaces and so forth. Thus, contemplated patterns include straight and curved lines, intersections of lines, lines with widened or narrowed areas, ribbons, overlapping lines. It is especially contemplated that useful patterns will include circuit board designs, both single and multi-layered designs. With respect to circuit boards, one significant aspect is that embodiments according to the present subject matter can be adapted to deposit a conductive composition, usually metal, in the "vias" or through-holes of a circuit board, thereby assisting in the production of multi-layered boards. Such vias may be produced in many different ways, of which drilling is especially preferred.

Other contemplated patterns include layers. For example, it is contemplated that a process of deposition described herein can be repeated to obtain depositions having thicker or multiple layers. Such process can use repeated or thicker coatings of the same metal or other substance, alternating layers by using alternating or dissimilar substances.

It is contemplated that a small amount of a solvent based polymer or a surfactant may also be useful additives for adjusting the rheology of the metal precursor solution for inkjet printing, and to impart better deposition forming properties. On the other hand, larger amounts of high boiling solvents and/or additives such as triethylphosphate, Triton X100, glycerol, etc., are preferably to be avoided as these have a tendency to contaminate the film produced on account of incomplete pyrolysis over temperature sensitive substrates such as KAPTON™ or paper. Still further, it may be worthwhile to treat the substrate with a coupling agent to improve the adhesion of the deposited material to the substrate as a function of the coupling agent's modifying the hydrophobicity or hydrophilicity of the surface of the substrate.

Substrate 120 can comprise virtually any substance upon which a compound can be deposited. For example, contemplated substrates include metals and non-metals, conductors and non-conductors, flexible and inflexible materials, absorbent and non-absorbent materials, flat and curved materials, textured and non-textured materials, solid and hollow materials, and both large and small objects. Particularly preferred substrates are circuit boards, paper, glass, and metal objects. Viewed from another perspective, the wide breadth of contemplated substrates gives some indication of the scope of contemplated objects to which the present teachings may advantageously be applied. Thus, methods and apparatus taught herein may be used for a variety of applications, including multichip modules, PCMCIA cards, printed circuit boards, silicon wafers, security printing, decorative printing, catalysts, electrostatic shielding, hydrogen transport membranes, functionally gradient materials, production of nanomaterials, battery electrodes, fuel cell electrodes, actuators, electrical contacts, capacitors, and so forth. Methods and apparatus taught herein may also be used to produce less intricate surface coatings, or even full surface coatings such as might be employed in preparing reflective coatings for mirrors. Methods and apparatus described are especially useful for preparing full or partial surface coatings on curved surfaces, such as decorations on the sides of a motor vehicle. For such applications, an ink jet type printer with head movement controlled in three dimensions may be used.

Accordingly, the substrate in FIG. 2 is contemplated to represent any suitable substrate, including especially a circuit board, which may or may not be installed in or form part of an electronic device such as a computer, disk drive or other data processing or storage device, a telephone or other communication device, and a battery, capacitor, charger, controller or other energy storage related device.

Several advantages of various aspects of the present teachings have been observed during experimentation. In one aspect, it has been observed that metal deposits made according to the present teachings, including, for example, conductive paths of circuit boards, can be made to have a remarkably smooth surface. Among other things, this high degree of smoothness has great utility in depositing pure metals, because such metals are resistant to oxidizing, and therefore tend to maintain high conductivity. From a quantitative viewpoint, preferred embodiments of deposits as described herein can measure less than about Ra 0.05 $\mu$m, and in particularly preferred embodiments less than about Ra 0.01 $\mu$m. Here, the definition of roughness is consistent with that discussed in U.S. Pat. No. 5,632,942 to Yeh et al. (May 1997). Roughness can be measured using a profilometer, e.g., a Sutronic 3P profilometer sold by the Taylor-Hobson Company. The effect of roughness on catalytic substance adhesion is seen by comparing the loss of catalytic substance from undercoated substrates at different surface roughnesses. Generally, an Ra roughness of less than about 0.05 $\mu$m is considered to be quite smooth, and tends to be resistant to degradation or surface adhesion. Surface roughness of less than about 0.01 $\mu$m is considered to have a polished appearance.

Another advantage of various embodiments of the present teachings is that the coatings can be made to adhere extremely well to substrates, in many instances much better than with other systems. For example, where thin copper lines are deposited on paper or plastic substrates using an ink jet type printer, the substrate can be repeatedly bent at a 90° angle without noticeable cracking or peeling of the lines.

Yet another advantage of various embodiments of the present teachings is that the coatings can be made to almost any desired thickness. Thus, very thin coatings can be made down to hundreds of Angstroms or less. This compares very favorably with some previous coating systems in which coatings of less than about several hundred Angstroms are considered difficult to achieve. On the other end of the scale, relatively thick coatings can also be made according to descriptions herein, such as thicknesses of several microns or more in a single pass. Still greater thicknesses can also be made by overlapping coatings, or by layering one coating on top of another. Again this compares favorably with other systems. In U.S. Pat. No. 5,314,825 to Morishita (May 1994), for example, it was stated that thicknesses of greater than several thousand Angstroms of copper, nickel, cobalt or tin were unreachable by the prior art, and that the method in that patent was an improvement because it could deposit such metals in thicknesses of 60 $\mu$m.

Still another advantage of various embodiments of the present teachings is that coatings can be deposited using otherwise ordinary printing equipment. Thus, embodiments disclosed herein may utilize an ink jet type dispenser, or a nib, while other embodiments may utilize a stamp or roller. Embodiments may also employ flexographic printing equipment, offset printing devices, silk screening, stamping or micro-stamping, and various spraying equipment. As mentioned above, it is contemplated that any printing process and equipment that uses inks can be employed effectively with embodiments of the present teachings. The ability to utilize such printing equipment not only lowers capital and production costs, but also greatly increases the speed at which deposits can be made on a substrate. The increase in speed is especially apparent when depositing complex patterns, or when depositing a plurality of different substances. In various embodiments of the present teachings, for example, an ink jet type dispenser could dispense different metal compounds as readily as it could dispense different color inks.

Still another advantage of various embodiments of the present teachings is that coatings can be deposited with a purity of at least 85% by weight. In more preferred embodiments the purity of the metal or other material intended to be included in the coating is at least 90%, in still more preferred embodiments the purity is at least 95%, and in most preferred embodiments the purity is at least 97%. Elemental copper, for example, has been deposited according to the present teachings at a purity of at least 97% by weight, and elemental gold has been deposited according to the present teachings at a purity of at least 85% by weight.

Still another advantage of various embodiments of the present teachings is that coatings can be deposited with very little waste. In preferred embodiments at least 85% by weight of the material to be deposited on the substrate remains to form the desired pattern. For example, if copper (I) formate complex is used to produce a copper circuit, then at least 85% of the copper deposited on the substrate remains to form the desired pattern, and no more than 15% of the copper is removed as "waste". In more preferred embodiments the waste is no more than 10%, in still more preferred embodiments the waste is no more than 5%, and in most preferred embodiments the waste is no more than 3%.

Still another advantage of various embodiments of the present teachings is the simplicity and efficiency of the process once the transition metal complex solution is deposited onto the substrate. It is contemplated that once the solution is deposited onto the substrate, that there is no need to deposit an independent reducing agent onto the substrate. The metal precursor solution is essentially self-contained and effectively ready to be decomposed to metal on the substrate upon application of energy.

Still another advantage of various embodiments of the present teachings is low temperature operation. Metals, for example, can be deposited in desired patterns at temperatures of less than about 150° C., preferably less than about 100° C., more preferably less than about 75° C., and most preferably at ordinary room temperatures of room temperature (25–30° C.). The redox or "curing" step can also be performed at relatively low temperatures below about 100° C., more preferably below about 75° C., and even as low as about 50° C. Even lower temperatures are also possible, although below about 50° C. the redox reaction tends to be too slow for most applications. These ranges allow precursor solutions to be prepared at room temperature, the deposition to be performed at room temperature, and the decomposition to be accomplished using relatively low heat, as from a heat gun, in a room temperature environment. In test embodiments, for example, a copper precursor was deposited on an ordinary piece of paper in an ink jet printer at room temperature, and the precursor was decomposed to provide essentially pure copper using a hair dryer. This and other examples are described below.

These and other benefits are especially apparent when employing metal compositions where the metal or metals exist at lower valence states, such as +2 or +1. The lower valence states mean relatively less ligand for a given amount of metal, and that in turn manifests as fewer bubbles or non-volatile impurity being produced during the redox reaction. Fewer bubbles produce better adhesion, higher conductivity (lower resistance), and assists in producing thicker layers of metal. The metals thus deposited are electrical conductors, having a conductivity substantially (i.e., with 80%) that of the pure metal(s) being deposited. The reactions also typically proceed at lower temperatures, which is especially valuable when employing Mylar™ or other temperature sensitive substrates.

EXAMPLES

Example 1

Five grams of copper (II) formate tetrahydrate was added in a 100 mL flask containing a stir bar, and placed in an oil bath maintained at 102° C. in an argon dry box containing 8.5 gm of β-picoline. The addition of copper (II) formate was carried out in four installments over a period of about 15 minutes. Care was taken to avoid the formation of a cake. The contents of the flask were allowed to stir for about ½ hour. The contents on cooling gave some solid. The system was subjected to vacuum for over 12 hours. A solid was obtained which had a composition of $Cu(HCOO).2\beta$-picoline. The copper (I) formate complex was isolated and dissolved in β-picoline. The solution formed was then used to deposit a copper film onto a substrate. The copper film thus formed is clearly an electrical conductor, having a conductivity approximately that of pure copper.

Example 2

Five grams of copper(II) formate tetrahydrate was added in a 100 mL flask containing a stir bar, and placed in an oil bath maintained at 102° C. in an argon dry box containing 8.5 gm of β-picoline. The addition of copper (II) formate was carried out in four installments over a period of about 15 minutes. Care was taken to avoid the formation of a cake. The contents of the flask were allowed to stir for about 12 hour. The contents on cooling gave some solid. The system was subjected to vacuum for over 12 hours. A solid was obtained which had a composition of $Cu(HCOO).2\beta$-picoline. The copper (I) formate complex formed in situ was then used to deposit a copper film onto a substrate.

Example 3

One gram of copper(II) formate tetrahydrate was added to 6.06 gm of β-picoline and placed in a 100 mL flask. Approximately 0.414 grams of copper powder was added to the flask, and the contents were stirred for about 5 hours until a yellow gelatinous mass appeared with the dissolution of copper powder. This mixture resulted in the formation of copper (I) formate complex in situ. The contents were maintained in a dry argon box.

Example 4

Ten grams of copper (II) formate tetrahydrate was added to a quartz boat and placed in a tube furnace having a flow of oxygen. The furnace was heated at the rate of 100° C./hour to 300° C. and maintained at 300° C. for 100 minutes, and finally cooled to room temperature. Fine copper powder was obtained which showed the presence of aggregates of submicron copper particles as shown by Scanning Electron Microscope.

Example 5

Preparation of hydrated gold (III) hydroxide: 36.5 gm of $AuCl_3$ was dissolved in 250 ml of deionized water and filtered through a fritted disc. The filtrate was diluted with another 680 ml of deionized water in a 2 liter beaker. To this solution 80 gm of basic magnesium carbonate was added in small lots over a period of 3 hours, and this resulted in the formation of a solid in the beaker. The contents of the beaker were stirred for 16 hours at room temperature. The contents were protected from light by wrapping an aluminum foil around the beaker. The solid was filtered on a sintered funnel and washed several times with N/13 sulphuric acid. The precipitates were then washed with deionized water until the filtrate was free of sulphate ions. This moist hydroxide weighed about 55 gm. It was kept in the freezer at about –10 to –20 C. for 16 hours.

Example 6

Preparation of Gold Precursor. 40 gm of hydrated gold hydroxide prepared as described above was treated with a mixture of 120 ml of glacial acetic acid and 24 ml of isobutyric acid in a round bottom flask kept in an oil bath at 55–65 C. for 15 hours. This solution was filtered through 0.45µ Acrodisc™. 120 ml of this solution was subjected to vacuum until the volume of the solution was reduced to about 30 ml. About 100 ml of pyridine was added while keeping the contents ice cold. The soluion was kept in the refrigerator for 8 hours. The solution was then brought to room temperature and filtered again using a 0.45µ Acrodisc™.

Example 7

Making a gold film using the gold precursor. A 1"×1" piece of Kapton™ was dip coated with the solution from Example 6, and allowed to drip until the excess precursor solution dripped off. The wet film was subjected to a hot air gun (model#VT-750, Master Appliances Corporation). A beautiful gold film was obtained.

Example 8

About 20 gm silver oxide was taken in a 250 ml round bottom flask containing about 60 ml of isobutyric acid. The contents were stirred at room temperature for 12 hours and were protected from light. The resulting solid was filtered and washed several times with diethyl ether and then dried in vacuuo for 6 hours at room temperature.

Example 9

10 gm of the above prepared silver isobutyrate was dissolved in about 30 ml of pyridine at room temperature while stirring for about 12 hours. The resulting solution was filtered through a 0.45µ Acrodisc™.

Example 10

About 4 ml of the silver precursor solution prepared in Example 9 above was taken in a 6 dram glass vial and heated over a hot air gun (model#VT-750, Master Appliances Corporation). A beautiful silver coating was obtained.

Thus, specific embodiments and applications of displays and methods for surface deposition metal precursors, and subsequently precipitates with at least 85% relative metal purity, have been disclosed. It should be apparent, however, to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

What is claimed is:

1. A method of laying down a metal on a substrate installed in or forming part of an electronic device comprising:

depositing a metal precursor comprising a metallic salt directly on a substrate installed in or forming part of an electronic device;

adding an energy derived from an extended source;

reducing the metal precursor and precipitating metal on the substrate installed in or forming part of an electronic device as a continuous metal layer, wherein the step of reducing the metal precursor occurs at a temperature less than about 150° C. and the continuous layer is an electrical conductor; and selecting the metal precursor and the energy such that the continuous layer is an electrical conductor and comprises at least 85% of the metal wherein the metal comprises an element where a highest d orbital occupied by an electron of the element is the 3d, 5d, or 6d.

2. The method of claim 1, wherein the continuous layer has an electrical conductivity of pure copper.

3. The method of claim 1, wherein the metal precursor comprises a ligand.

4. The method of claim 3, wherein the ligand comprises a material selected from the group consisting of an amine, an amide, a phosphine, a sulfide, and an ester.

5. The method of claim 3, wherein the ligand is selected from the group consisting of a nitrogen donor, a sulfur donor, and a phosphorus donor.

6. The method of claim 1, wherein the extended source is an infra-red source.

7. The method of claim 1, wherein the extended source is a microwave source.

8. The method of claim 1, wherein the coating has a thickness of less than about 100 nanometers.

9. The method of claim 1, wherein the metal comprises cobalt, copper, nickel, zinc, vanadium, chromium, platinum, gold, or tungsten.

10. The method of claim 9, wherein the metal comprises copper.

11. A method of depositing a metal in a desired pattern onto a substrate installed in or forming part of an electronic device by:

depositing a metal precursor directly onto the substrate installed in or forming part of an electronic device in the desired pattern, wherein the metal precursor comprises a metallic salt;

applying sufficient energy to the metal precursor in the form of an extended source;

reducing the metal precursor, wherein the step of reducing the metal precursor occurs at a temperature less than about 150° C.; and precipitating a metal in the desired pattern, said layer having an electrical conductivity substantially that of the pure metal wherein the metal comprises an element where a highest d orbital occupied by an electron of the element is the 3*d*, 5*d*, or 6*d*.

12. The method of claim 11, wherein the pattern comprises an electrical circuit.

13. The method of claim 11, wherein the step of depositing the precursor is selected from the group consisting of spraying, stamping, roller printing, letter press printing, gravure printing, screen printing, flexographic printing, planographic printing, offset printing, and mimeograph printing.

14. The method of claim 11, wherein the step of reducing the metal precursor occurs at a temperature less than about 100° C.

15. The method of claim 11, wherein the steps of reducing the metal precursor occurs at about room temperature.

16. The method of claim 11, wherein the metal comprises cobalt, copper, nickel, zinc, vanadium, chromium, platinum, gold, or tungsten.

* * * * *